United States Patent [19]

Smith et al.

[11] Patent Number: 4,635,280

[45] Date of Patent: Jan. 6, 1987

[54] BIT SYNCHRONIZER FOR DECODING DATA

[75] Inventors: Donald E. Smith; Richard D. Roberts, both of Palm Bay, Fla.

[73] Assignee: Harris Corporation, Melbourne, Fla.

[21] Appl. No.: 737,999

[22] Filed: May 28, 1985

[51] Int. Cl.[4] .............................................. H03D 3/24
[52] U.S. Cl. .................................... 375/120; 375/94; 328/155; 360/48
[58] Field of Search ...................... 375/37, 80, 81, 82, 375/94, 106, 110, 111, 119, 120; 360/37.1, 40, 41, 44, 48, 51; 340/347 DD; 328/155

[56] References Cited

U.S. PATENT DOCUMENTS

| 4,005,479 | 1/1977 | Hunnicutt et al. | 360/51 |
| 4,065,796 | 12/1977 | Dehart | 360/51 |
| 4,124,778 | 11/1978 | Amass | 179/15 BS |
| 4,204,199 | 5/1980 | Isailovic | 340/347 DD |
| 4,232,388 | 11/1980 | Isailovic | 375/110 |
| 4,307,381 | 12/1981 | Isailovic | 340/347 DD |
| 4,371,974 | 2/1983 | Dugan | 375/82 |
| 4,380,815 | 4/1983 | Clendening | 375/120 |
| 4,400,667 | 8/1983 | Belkin | 375/120 |
| 4,414,659 | 11/1983 | Beckers | 369/59 |
| 4,419,699 | 12/1983 | Christopher et al. | 358/340 |

Primary Examiner—Robert L. Griffin
Assistant Examiner—Stephen Chin
Attorney, Agent, or Firm—John L. DeAngelis, Jr.

[57] ABSTRACT

A bit synchronizer for Miller-encoded data includes a phase-locked loop for synchronizing the Miller-encoded data to the clock signal necessary for proper decoding thereof. The phase-locked loop includes a monostable multivibrator that is triggered on each transition of the Miller-encoded data. The monostable multivibrator controls the operation of two flip-flops that produce time-varying signals when the clock is leading or lagging the Miller-encoded data. The flip-flop output signals are constant when the clock is in phase with the Miller-encoded data. The flip-flop output signals are integrated, and the resultant signal controls a voltage-controlled oscillator so that the clock signal is phase coherent with the Miller-encoded data signal.

9 Claims, 4 Drawing Figures

BIT SYNCHRONIZER FOR DECODING DATA

FIELD OF THE INVENTION

This invention relates generally to a method and apparatus for synchronizing a clock signal to an encoded data signal for use in decoding thereof, and more specifically, to a method and apparatus for synchronizing a clock signal to Miller-encoded data for accurate decoding thereof.

BACKGROUND OF THE INVENTION

There are many well-known techniques for encoding digital data for transmission or recording. One such popular technique is called Miller encoding, where digital ones and zeros are represented by transitions at different locations during a bit cell. A bit cell is the time interval occupied by each data bit. The placement of the transition within the bit cell conveys information regardless of the polarity of the transition, i.e., a high-to-low transition or a low-to-high transition. In Miller encoding, a one bit is encoded with a transition (from the previous state) at the middle of the bit cell. Consecutive zero bits are encoded by a transition at the beginning of each bit cell. Single, isolated zero bits are ignored, i.e., there are no transitions for single isolated zeros. Miller encoding permits regeneration of the clock signal from the Miller-encoded data signal; however, for proper decoding the clock signal must have a rate of twice the bit cell time. That is, two clock pulses must occur during each bit cell.

One disadvantage associated with Miller-encoding is that the encoded data does not have a regularly-repetitive transition edge for use in synchronizing a clock signal; that is, transitions may occur at one bit cell interval, one-and-one half bit cell intervals, or two bit cell intervals depending on the data pattern. The data is said to be "missing transitions" and hence it is not possible to employ a simple phase detector to compare the Miller-encoded data signals and the clock signal to synchronize them (i.e., to make the Miller-encoded data signal and the clock signal phase coherent). A phase detector looks at signal transitions or edges; with missing transitions for certain data patterns, the phase detector output would be erroneous.

One technique for synchronizing Miller-encoded data to a clock signal is disclosed in U.S. Pat. No. 4,124,778, entitled "Digital Frame Synchronizing Circuit." This patent discloses a phase-locked loop (including a phase detector and a voltage-controlled oscillator) to provide bit synchronization and clock signal regeneration. The well-known Miller encoding scheme is modified to provide a synchronization signal having a duration of three bit cells, thus generating a lower frequency signal than the Miller-encoding scheme. The phase-locked loop includes a feedback gate that is controlled by the synchronization signal. The feedback gate permits the clock signal from the voltage-controlled oscillator to be received as an input to the phase detector only when the synchronization signal is high. The phase detector compares the Miller-encoded signal and the clock signal to control the voltage-controlled oscillator so that a clock signal at twice the bit cell rate, which is necessary for decoding of the Miller-encoded data, is provided.

SUMMARY OF THE INVENTION

Although Miller encoding has various advantages as discussed above, the primary disadvantage is the characteristic missing transitions in the data. The missing transition occurs in a 1-0-1 data sequence, because in Miller encoding, there is no transition for a single isolated zero. One advantage of Miller encoding is the ability to generate a clock signal from the data signal, but it is necessary to compensate for the missing transitions when producing the clock signal. A clock signal with a frequency of twice the Miller-encoded signal is required for decoding.

The present invention is a bit synchronizer employing a phase-locked loop in a unique configuration that allows regeneration of the clock signal from the data signal, despite the missing transitions in the latter. According to the inventive principles, the phase-locked loop includes a phase comparator, integrator, and voltage-controlled oscillator. The phase comparator produces two output signals, and when the regenerated clock signal is phase-locked to the Miller-encoded signal, the two signals from the phase comparator are continuously in a high state. When the clock signal is either leading or lagging the Miller-encoded data, short pulses appear in one of the two output signals from the phase comparator. These pulses are integrated by the integrator and control the voltage-controlled oscillator in such a manner to bring the clock signal back into phase synchronization with the Miller-encoded signal.

Further according to the inventive principles, when the Miller-encoded data is not being received, the bit synchronizer is locked to an oscillator, which produces a signal at the clock frequency. When Miller-encoded data is received, the bit synchronizer is switched to receive the Miller-encoded data and regenerate the clock signal based thereon. Locking the bit synchronizer to the oscillator when no Miller data is received allows the bit synchronizer to lock quickly onto the transitions in the Miller encoded data when received. Thus, the capture time of the bit synchronizer (or phase-locked loop) is decreased.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF THE PREFERRED EMBODIMENTS

Figure 1:
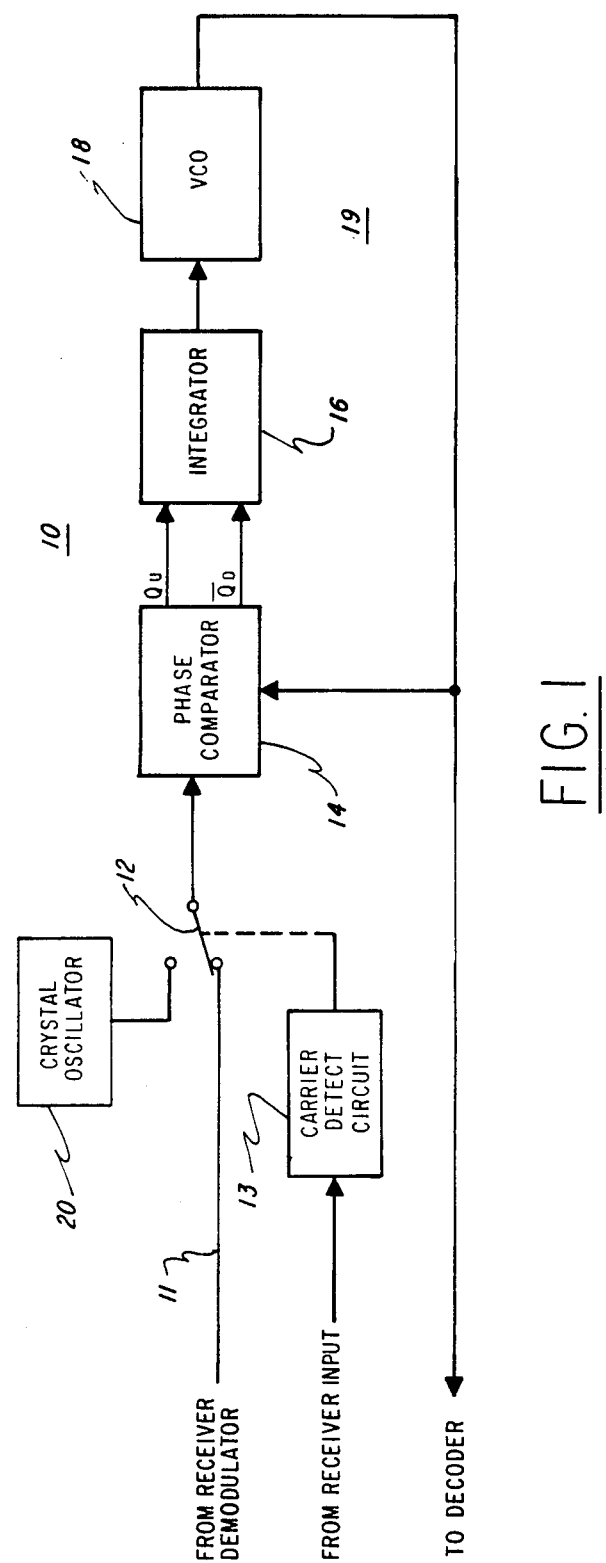
FIG. 1 is a block diagram of a bit synchronizer constructed according to the teachings of the present invention.

FIG. 1 shows a bit synchronizer 10, which is part of a receiver (not shown), and is responsive to a signal from the receiver demodulator (not shown) on a conductor 11. In the preferred embodiment, the receiver receives a carrier signal modulated by a Miller-encoded data signal, and demodulates it to reproduce the Miller-encoded data signal. A phase comparator 14 is coupled to receive the Miller-encoded data signal via a switch 12 when the latter is in the position shown in FIG. 1. The phase comparator 14 produces two output signals, designated $Q_U$ and $\overline{Q_D}$ that are supplied as inputs to an integrator 16. An output signal from the integrator 16 is supplied as an input to a voltage-controlled oscillator 18. The voltage-controlled oscillator 18 produces the clock signal, having a frequency of twice the Miller-encoded data. The clock signal is fed as an input signal to the phase comparator 14 and also to a decoder, not shown in FIG. 1. The decoder uses the clock signal to decode the Miller-encoded data and reproduce the one and zero bits containing the information. Such Miller decoders are well-known in the art. The phase comparator 14, the integrator 16, and the voltage-controlled oscillator 18 constitute a phase-locked loop 19.

The carrier detect circuit 13 controls the position of the switch 12. The carrier detect circuit 13 is responsive to the signal input to the receiver for detecting the presence of a carrier signal. When a carrier signal is present, the switch 12 is in the position shown in FIG. 1 so that the phase comparator 14 is responsive to the received demodulated signal for use in generating the clock signal. When carrier is absent, the carrier detect circuit 13 places the switch 12 in the upper position such that the phase comparator 14 is responsive to a signal from a crystal oscillator 20.

According to the inventive principles, the crystal oscillator 20 is necessary to overcome a disadvantage associated with the use of a phase-locked loop when no signal is being received and therefore there is no signal on the conductor 11 from the demodulator. When the receiver is not receiving a signal, no signal will be present on the conductor 11 and the output signals $Q_U$ and $\overline{Q_D}$ from the phase comparator 14 will not contain useful information. This causes the voltage-controlled oscillator 18 to drift away from the desired clock frequency. It is also possible that without useful information from the phase comparator 14, the integrator 16 may integrate to the supply voltage, thus forcing the phase-locked loop 19 into a non-linear state. To overcome this disadvantage, the carrier detect circuit 13 moves the switch 12 into a position such that the phase comparator 14 is responsive to the signal from the crystal oscillator 20. The signal therefrom has a frequency approximating the frequency of the clock signal, thereby giving the phase comparator 14 useful information and causing the phase-locked loop 19 to lock onto a frequency reasonably close to the desired clock frequency. The phase-locked loop 19 thus operates in a linear region and avoids the problems associated with the non-linearities created when a signal is not present on the conductor 11.

Figure 2:
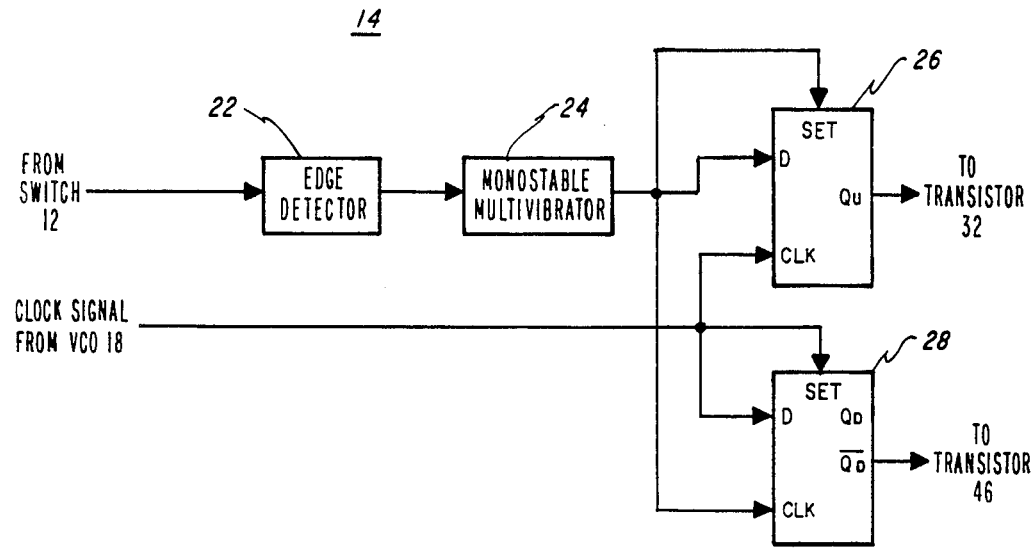
FIG. 2 is a block diagram of the phase comparator illustrated in FIG. 1.

FIG. 2 is a block diagram of the elements of the phase comparator 14, according to the inventive principles. An input terminal of an edge detector 22 is connected to the wiper of the switch 12; a signal from the edge detector 22 is input to a monostable multivibrator 24. An output signal from the monostable multivibrator 24 is input to a D and a set input terminals of a D flip-flop 26. The output signal from the mono-stable multivibrator 24 is also input to a clock input terminal of a D flip-flop 28. The clock signal from the voltage-controlled oscillator 18 is supplied as an input to a clock input terminal of the D flip-flop 26, to a D input terminal of the D flip-flop 28, and to a set input terminal of the D flip-flop terminal 28. The D flip-flop 26 produces the $Q_U$ signal, and the D flip-flop 28 produces the $Q_D$ and $\overline{Q_D}$ signals.

In operation, when the clock signal is in phase with the Miller-encoded data signal, the signals $Q_U$ and $Q_D$ are in a high state ($\overline{Q_D}$ is low). This causes the output signal from the integrator 16 to be constant, and the constant input signal to the voltage-controlled oscillator 18 causes no change in the frequency of the clock signal. When the clock signal is leading or lagging the Miller encoded data signal, pulses appear in the $Q_U$, $\overline{Q_D}$ and $Q_D$ signals. These pulses are integrated by the integrator 16, causing the voltage-controlled oscillator 18 to change the frequency of the clock signal to synchronize the clock signal and Miller-encoded data signal.

The edge detector 22 detects positive and negative transitions in the signal from the switch 12 and converts these to short pulses, which trigger the monostable multivibrator 24.

Figure 3:
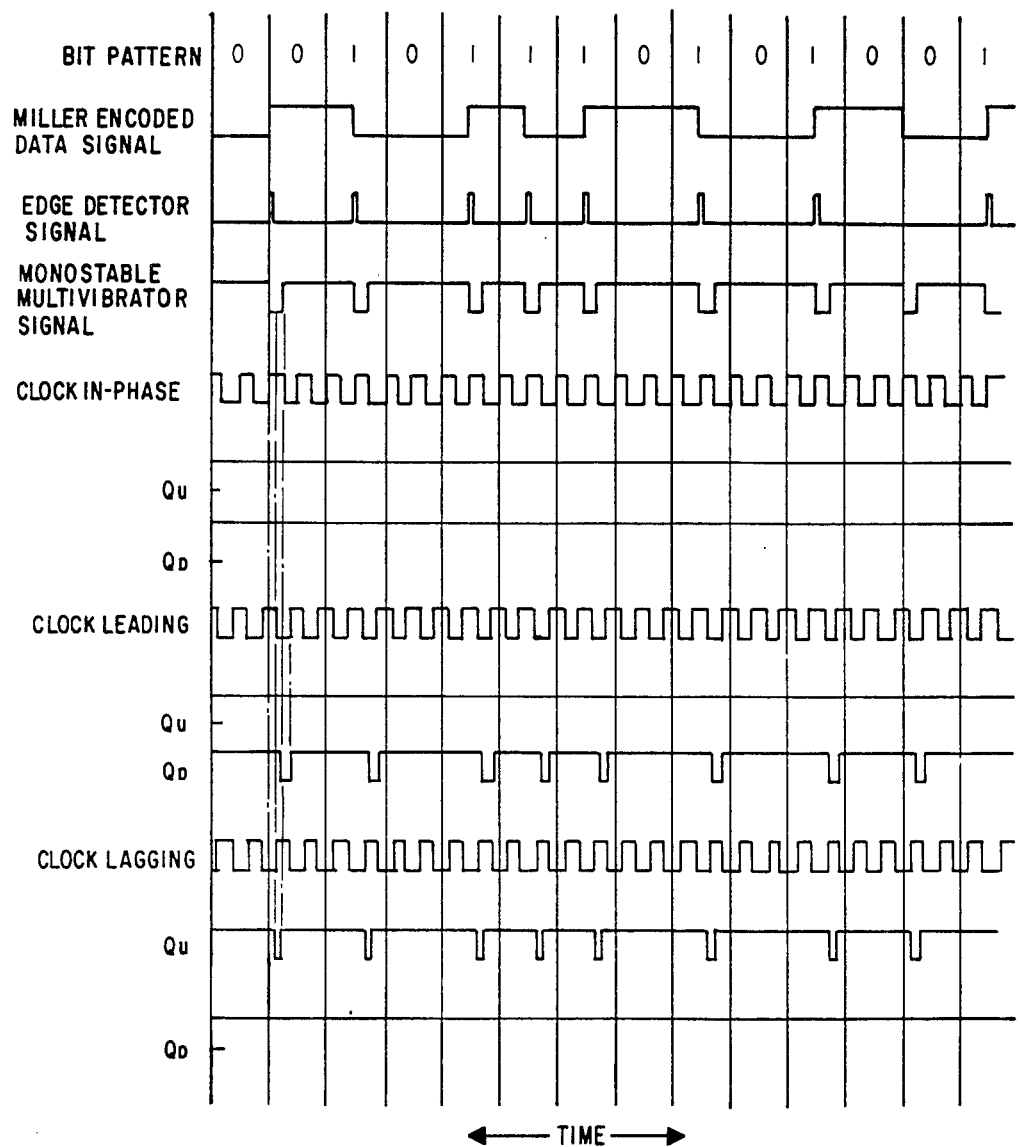
FIG. 3 is a timing diagram showing the operation of the phase comparator of FIG. 2.

Referring to FIG. 3, there is shown a sample bit pattern and the Miller-encoded data signal for that bit pattern. As previously discussed, for each one bit there is a transition in the Miller-encoded data signal at approximately the midpoint of the bit cell. For two consecutive zeros, there is a transition between each zero. There is no transition in the Miller-encoded data signal for a zero immediately following a one. The monostable multivibrator output signal is also shown in FIG. 3. There is a transition in the monostable multivibrator output signal for each transition of the Miller-encoded data signal. The duration of the monostable output pulse is controlled by a capacitor not shown in FIG. 2; in the preferred embodiment the monostable multivibrator pulse has a duration of approximately 0.25 of a bit period. The clock-in-phase segment of FIG. 3 shows the signals $Q_U$ and $Q_D$ and a clock signal in phase with the Miller-encoded data signal. Before explaining the operation of the phase comparator 14, it should be noted that in the preferred embodiment the set input terminal of the D flip-flops 26 and 28 is a level/asynchronous input terminal that overrides the D and clock input terminals. Also, in the preferred embodiment the D flip-flops 26 and 28 trigger on positive-going transitions of the signal input to the clock terminals thereof. Further, due to the hold time of the D flip-flops 26 and 28, the D flip-flops 26 and 28 see the signal at each respective D input terminal just prior to a positive going transition in the clock signal.

Refer to FIG. 2 and the clock-in-phase segment of FIG. 3. Because the set input terminal of the D flip-flop 26 is responsive to the monostable multivibrator signal, the signal $Q_U$ is high whenever the monostable multivibrator signal is high. Even when the monostable multivibrator signal goes low, (see FIG. 3), the $Q_U$ signal remains high because the D input terminal sees the signal immediately prior to the positive-going transition of the in-phase clock signal. Thus the D input terminal sees a high state and $Q_U$ remains high. When the next positive going transition of the clock occurs, the monostable multivibrator signal has returned to a high state and thus through the action of the set input, $Q_U$ remains high.

With respect to the D flip-flop 28, the monostable multivibrator signal is the clock input thereto. At every positive-going transition of the monostable multivibrator signal the clock signal, which is input to the D input terminal, is high (considering the hold time of the D flip-flop 28) and therefore $Q_D$ remains high. Thus, when the clock signal from the voltage-controlled oscillator 18 is in-phase with the Miller-encoded data signal, the signals $Q_U$ and $Q_D$ remain high. The voltage-controlled oscillator 18 therefore sees a constant input signal and the frequency of the clock signal is not changed.

The clock-leading segment of FIG. 3 shows that when the clock is leading the Miller encoded data signal pulses are produced in the signal $Q_D$. These pulses are integrated in the integrator 16, supplying a signal to the voltage-controlled oscillator 18 that causes the voltage-controlled oscillator 18 to bring the clock back into phase with the Miller encoded data signal. The pulses occur in $Q_D$ because when the mono-stable multivibrator signal (which is the clock input to the D flip-flop 28) goes high, the D input terminal sees a low state of the clock signal. Thus, $Q_D$ goes low. When the clock signal from the voltage-controlled oscillator 18 (provided as an input to the set input terminal) goes high, $Q_D$ returns to the high state.

$Q_U$ is always high when the clock is leading. When the mono-stable multivibrator signal is high the set input terminal of the D flip-flop 26 is high and $Q_U$ is high. When the monostable multivibrator signal goes low, this does not effect $Q_U$ because positive-going transitions of the clock signal occur only when the monostable multivibrator signal is high. See FIG. 3 for this timing relationship.

Referring to the clock lagging-segment of FIG. 3, pulses appear in the signal $Q_U$ that cause the voltage-controlled oscillator 18 to bring the lagging clock signal in phase with the Miller encoded data signal. The pulses appear in $Q_U$ because during each negative data pulse in the monostable multivibrator signal, there is a positive going transition in the lagging clock signal. Thus the D input terminal of the D flip-flop 26 sees a low state on a positive-going transition of the clock signal and $Q_U$ goes low. $Q_U$ goes high when the monostable multivibrator signal goes high, driving the set input terminal, and thus $Q_U$ high. For the lagging clock case, $Q_D$ remains high because for each positive-going transition of the monostable multivibrator signal, the signal at the D input terminal of the D flip-flop 28 is also high.

Figure 4:
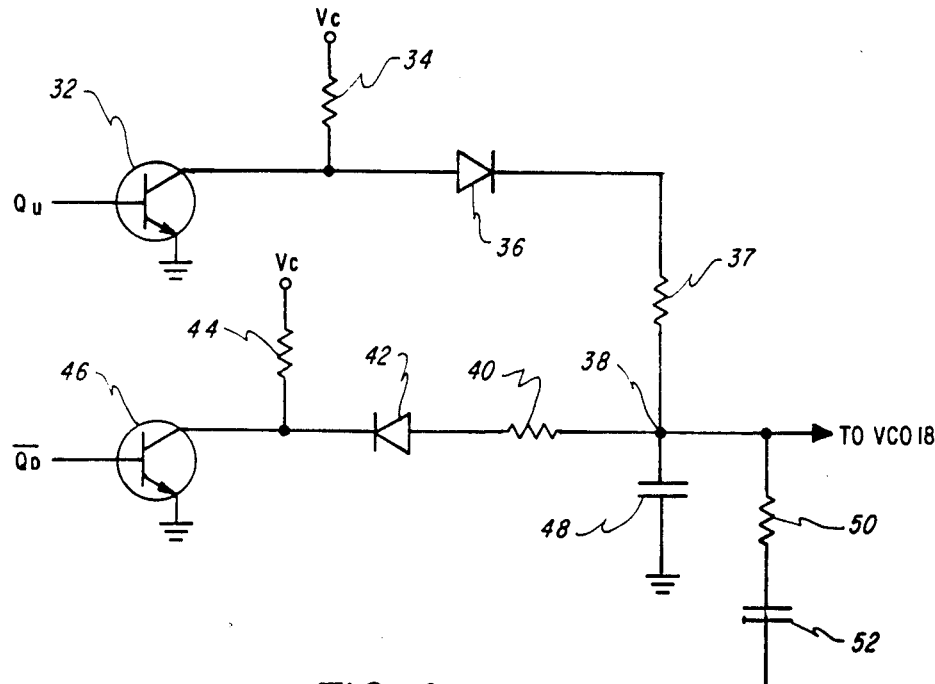
FIG. 4 is a schematic diagram of the integrator of FIG. 1.

FIG. 4 shows a schematic diagram of a preferred embodiment for the integrator 16 of FIG. 1. The signal $Q_U$ from the phase comparator 14 is supplied as an input to a base terminal of a transistor 32. The emitter terminal thereof is connected to ground, and the collector terminal thereof is connected to a power supply (designated $V_C$) via a resistor 34. A diode 36 is connected between the collector terminal of the transistor 32 and a terminal 38, with the cathode terminal connected to the terminal 38 via a resistor 37. The signal $\overline{Q_D}$ from the phase comparator 14 is supplied as an input to a base terminal of a transistor 46. $\overline{Q_D}$ has a waveform of opposite polarity to that of $Q_D$, illustrated in FIG. 3. The emitter terminal thereof is connected to ground, and the collector terminal thereof is connected to the power supply (designated $V_C$) via a resistor 44. The cathode terminal of the diode 42 is also connected to the collector terminal of the transistor 46. The anode terminal of the diode 42 is connected to the terminal 38 via a resistor 40. The terminal 38 is connected to ground via a capacitor 48, and is also connected to ground via a series combination of a resistor 50 and a capacitor 52. The terminal 38 is connected to the input terminal of the voltage-controlled oscillator 18, as illustrated in FIG. 1.

In the preferred embodiment, the integrator 16 is designed to source between two and three volts to a high impedance load, i.e., the voltage-controlled oscillator 18. If the clock signal is in-phase with the Miller-encoded data signal and has been for some time, the capacitors 48 and 52 are charged to a constant potential. The transistor 32 is normally on and the transistor 46 is normally off, therefore diodes 36 and 42 are reverse biased and no charge is being added to or subtracted from the capacitors 48 and 52. If the clock signal is lagging the Miller-encoded data signal, pulses appear in the signal $Q_U$. See FIG. 3. These pulses turn off the transistor 32, forward biasing the diode 36; current flow into the capacitors 48 and 52 is approximately given by the following equation.

$$I = \frac{V_C - V_{OUT} - V_{36}}{R_{34} + R_{37}}$$

Wherein $V_{OUT}$ is the voltage at the terminal 38, $V_{36}$ is the voltage drop across the diode 36, $R_{34}$ is the ohmic value for the resistor 34, and $R_{37}$ is the ohmic value for the resistor 37. $V_{OUT}$ thus increases, causing the voltage-controlled oscillator 18 to increase the clock frequency so that the clock signal and the Miller-encoded data signal approach an in-phase condition.

Similarly, if the clock signal is leading the Miller-encoded data signal, pulses appear in the signal $\overline{Q_D}$, which turn on the transistor 46. The action forward biases the diode 42 and current flows out of the capacitors 48 and 52 to ground via the transistor 46. The current is approximately given by the following equation.

$$I = \frac{V_C - V_{OUT} - V_{42} - V_{sat}}{R_{40}}$$

Wherein $V_{42}$ is the voltage drop across the diode 42, $V_{sat}$ is the saturated collector to emitter voltage drop of the transistor 46, and $R_{40}$ is the ohmic value for the resistor 40. This lowers $V_{OUT}$ causing the voltage-controlled oscillator 18 to decrease the clock frequency so that the clock signal and the Miller-encoded data signal approach an in-phase condition.

In another embodiment of the present invention the signals $Q_U$ and $\overline{Q_D}$ are modified to have equal on/off duty cycles when the clock is in phase with the Miller-encoded data signal. With this technique, an equal quantity of charge is being continuously added to and substracted from the capacitors 48 and 50 during in-phase conditions, thus providing more stable jitter-free operation of the phase-locked loop 19.

While several embodiments in accordance with the present invention have been shown and described, it is understood that the same is not limited thereto but is susceptible of numerous changes and modifications as known to a person skilled in the art, and we therefore do not wish to be limited to the details shown and described herein, but intend to cover all such changes and modifications as are obvious to one of ordinary skill in the art.

What is claimed is:

1. Apparatus for producing a clock signal for use in decoding a Miller-encoded data signal, comprising:
   means for providing an output pulse of a predetermined duration at each transition of the Miller-encoded data signal;
   voltage-controlled oscillator means for producing the clock signal;
   processor means responsive to the clock signal and said output pulses for producing a first synchronizing signal at a first output terminal, wherein said first synchronizing signal is a plurality of pulses when the clock signal is phase-lagging the Miller-encoded data signal and is at a constant value otherwise, and for producing a second synchronizing signal at a second output terminal, wherein said second synchronizing signal is a plurality of pulses when the clock signal is phase-leading the Miller-encoded data signal and is a constant value otherwise;

integrator means responsive to said first and said second synchronizing signals for producing an integrated signal in response thereto;

wherein said voltage-controlled oscillator means is responsive to said integrated signal for controlling the frequency and phase of said clock signal such that the clock signal and the Miller-encoded data signal are phase coherent.

2. The apparatus of claim 1 including means for providing a frequency reference signal that is supplied as an input to the processor means when the Miller-encoded data signal is not present.

3. Apparatus for producing a clock signal for use in decoding a Miller-encoded data signal, comprising:
  means for providing an output signal, wherein said output signal is in a first state, and goes to a second state for a predetermined duration at each transition of the Miller-encoded data signal;
  processor means for producing first and second control signals;
  integrator means responsive to said first and said second control signals for producing an integrated signal in response thereto;
  voltage-controlled oscillator means for controlling the phase and frequency of the clock signal in response to said integrated signal;
  wherein said processor means is responsive to said output and said clock signals;
  wherein said first control signal is set to remain in a first state when said output signal is in the first state, and wherein said first control signal goes to a second state when said output signal is in the second state while said clock signal undergoes a transition from a first to a second state;
  wherein said second control signal is set to remain in a first state when said clock signal is in the second state, and wherein said second control signal goes to a second state when said clock signal is in the first state while said output signal undergoes a transition from a second to a first state.

4. Apparatus for producing a clock signal for decoding a Miller-encoded data signal, comprising:
  means for providing a first signal that undergoes a transition from a first to a second state at each transition of the Miller-encoded data signal;
  first flip-flop means including a set input terminal responsive to said first signal, wherein when said first signal goes to the first state, a first flip-flop signal is set to a first state;
  said first flip-flop means including a clock input terminal responsive to the clock signal;
  said first flip-flop means including a data input terminal responsive to said first signal, wherein said first flip-flop signal goes to the same state as said first signal at a prescribed point on the clock signal waveform;
  second flip-flop means including a set input terminal responsive to the clock signal, wherein a second flip-flop signal is set to a first state when the clock signal goes to the first state;
  said second flip-flop means responsive to said first signal at a clock input terminal thereof;
  said second flip-flop means including a data input terminal responsive to the clock signal, wherein said second flip-flop signal goes to the same state as the clock signal at a prescribed point on the waveform of said first signal;
  integrator means responsive to said first and second flip-flop signals for producing an integrated signal in response thereto;
  voltage-controlled oscillator means for controlling the phase and frequency of the clock signal in response to said integrated signal, wherein the clock signal is in phase with the Miller-encoded data signal.

5. The apparatus of claim 4 wherein the first flip-flop means includes a D flip-flop, and wherein the data input terminal includes a D input terminal.

6. The apparatus of claim 4 wherein the second flip-flop means includes a D flip-flop, and wherein the data input terminal includes a D input terminal.

7. Apparatus for decoding a data stream which has been encoded in the form of a Miller-encoded data signal, comprising:
  means for providing an output pulse of a predetermined duration at each transition of the Miller-encoded data signal;
  voltage-controlled oscillator means for producing a clock signal;
  processor means responsive to said clock signal and said output pulses for producing a first synchronizing signal at a first output terminal wherein said first synchronizing signal is a plurality of pulses when said clock signal is phase-lagging the Miller-encoded data signal and is at a constant value otherwise, and for producing a second synchronizing signal at a second output terminal, wherein said second synchronizing signal is a plurality of pulses when the clock signal is phase-leading the Miller-encoded data signal and is at a constant value otherwise;
  integrator means responsive to said first and said second synchronizing signals for producing an integrated signal in response thereto;
  wherein said voltage-controlled oscillator means is responsive to said integrated signal for controlling the frequency and phase of said clock signal such that said clock signal and the Miller-encoded data signal are phase coherent;
  decoder means responsive to said clock signal and the Miller-encoded data signal for recovering the data stream.

8. Apparatus for demodulating a carrier signal modulated by a Miller-encoded data signal, and for decoding an information signal which has been encoded in the form of a Miller encoded data signal, said apparatus comprising:
  demodulator means responsive to said modulated carrier signal, said demodulator means for demodulating the modulated carrier signal to recover the Miller-encoded data signal;
  means for providing a frequency reference signal;
  detector means for detecting the presence of the modulated carrier signal;
  pulse-producing means selectably responsive to said frequency reference signal when the modulated carrier is not present, and selectably responsive to the Miller-encoded data signal when the modulated carrier signal is present, said pulse producing means for providing an output pulse of a predetermined duration when the signal input thereto undergoes a transition;

voltage-controlled oscillator means for producing a clock signal;

processor means responsive to said clock signal and said output pulses for producing a first plurality of pulses at a first output terminal when said clock signal is phase-lagging the Miller-encoded data signal, and for producing a second plurality of pulses at a second output terminal when said clock signal is phase-leading the Miller-encoded data signal;

integrator means responsive to said first and said second plurality of pulses for producing an integrated signal in response thereto;

wherein said voltage-controlled oscillator means is responsive to said integrated signal for controlling the frequency and phase of said clock signal such that said clock signal and the Miller-encoded data signal are phase coherent;

decoder means responsive to said clock signal and the Miller-encoded data signal for recovering the information signal.

9. A method for producing a clock signal for use in decoding a Miller-encoded data signal, comprising:
 (a) providing an output pulse of a predetermined duration at each transition of the Miller-encoded data signal;
 (b) providing the clock signal;
 (c) producing a first synchronizing signal having a plurality of pulses when the clock signal is phase-lagging the Miller-encoded data signal and having a constant value otherwise, and producing a second synchronizing signal having a plurality of pulses when the clock signal is phase-leading the Miller-encoded data signal and having a constant value otherwise;
 (d) integrating said first and said second synchronizing signals;
 (e) controlling the phase of said clock signal in response to step (d) such that the clock signal and the Miller-encoded data signal are phase coherent.

* * * * *